(12) United States Patent
Proctor (10) Patent No.: US 10,754,075 B1
(45) Date of Patent: Aug. 25, 2020

(54) LIGHT ASSEMBLY HAVING A RING-SHAPED LIGHTGUIDE WITH A PLURALITY OF LIGHT INCIDENT PORTIONS

(71) Applicant: SIGNIFY HOLDING B.V., Eindhoven (NL)

(72) Inventor: Kyle Proctor, Decatur, GA (US)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/379,577

(22) Filed: Apr. 9, 2019

(51) Int. Cl.
*F21V 5/00* (2018.01)
*F21V 8/00* (2006.01)
*F21V 7/04* (2006.01)
*F21Y 115/10* (2016.01)

(52) U.S. Cl.
CPC ............ *G02B 6/0001* (2013.01); *F21V 7/041* (2013.01); *F21V 2200/00* (2015.01); *F21Y 2115/10* (2016.08)

(58) Field of Classification Search
CPC ..... F21V 5/007; F21Y 2105/18; H01H 9/161; G02B 6/0073; G02B 6/0078
See application file for complete search history.

(56) References Cited

U.S. PATENT DOCUMENTS

| | | | | |
|---|---|---|---|---|
| 4,544,259 A * | 10/1985 | Kanaoka | ............... | G02B 6/4249 346/46 |
| 5,039,832 A * | 8/1991 | Polacek | ................. | H03K 17/18 200/317 |
| 5,308,943 A * | 5/1994 | Screven | ............. | H01H 11/0006 200/327 |
| 5,349,504 A * | 9/1994 | Simms | .................. | F21V 7/0091 362/249.02 |
| 6,443,582 B1 * | 9/2002 | Tarne | ..................... | G02B 6/003 362/23.16 |
| 7,380,962 B2 * | 6/2008 | Chaves | ................... | F21S 41/24 362/293 |
| 7,588,359 B2 * | 9/2009 | Coushaine | ........... | B60Q 1/2696 362/555 |
| 7,618,171 B2 * | 11/2009 | Tessnow | .............. | F21S 48/1154 362/511 |
| 7,789,531 B2 * | 9/2010 | Duong | .................... | H01L 33/20 362/257 |
| 7,837,350 B2 * | 11/2010 | Tsao | .......................... | F21V 5/02 362/246 |
| 7,934,840 B2 * | 5/2011 | Hwang | ................ | G02B 6/0046 353/122 |
| 8,704,259 B2 * | 4/2014 | Beneitez | ................. | F21V 5/007 257/98 |
| 9,423,101 B2 * | 8/2016 | Holten | .................. | F21V 7/0091 |
| 2007/0011862 A1 | 1/2007 | Mertens | | |

FOREIGN PATENT DOCUMENTS

| | | | |
|---|---|---|---|
| EP | 1767967 A2 | 3/2007 | |
| GB | 2365962 A | 2/2002 | |
| KR | 20140015094 A | 2/2014 | |

* cited by examiner

*Primary Examiner* — Ismael Negron (57) ABSTRACT

An indicator light assembly includes a lightguide with a plurality of light directing optical devices each having a light receiving end, a sidewall, and a light emitting end coupled to each other to form a ring-shaped light exit surface; and a plurality of light sources positioned at the light receiving ends, such that light from the light sources enters the light receiving ends and is directed towards the light exit surface by the sidewalls.

18 Claims, 12 Drawing Sheets

FIG. 14

LIGHT ASSEMBLY HAVING A RING-SHAPED LIGHTGUIDE WITH A PLURALITY OF LIGHT INCIDENT PORTIONS

TECHNICAL FIELD

Embodiments of the present disclosure relate generally to lighting systems, and more particularly to an indicator light assembly.

BACKGROUND

In the recent years, there has been a widespread adoption of smart devices in various sectors. For example, in the lighting sector, smart light fixtures have been of particular interest because of their capabilities to provide significant consumer benefits and value. These smart fixtures feature embedded wireless radio communication and firmware. Further, they can be networked with other smart products, such as switches, smart speakers, sensors and plugs, and can be automated or controlled using mobile apps, rule-based triggers, voice commands, scenes, timers, etc.

Smart light fixtures may need visual indicators to allow visual interaction with a user. For example, existing smart devices such as smart speakers typically include indicator light assemblies that generate indicator light (e.g., light ring) to visually communicate a status of the smart devices to a user.

Figure 9:
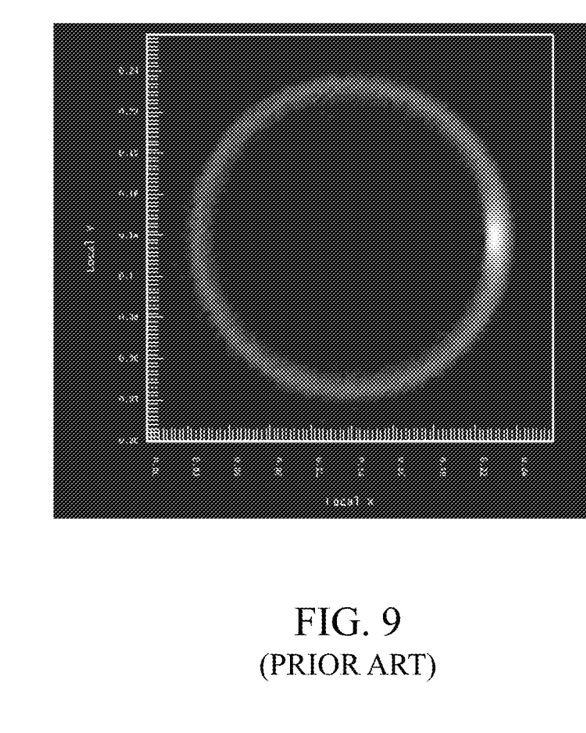
FIG. 9 illustrates a visual performance rendering of a prior art indicator light assembly when one of the LEDs is lit, in accordance with an embodiment of the prior art indicator light assembly.
Figure 11:
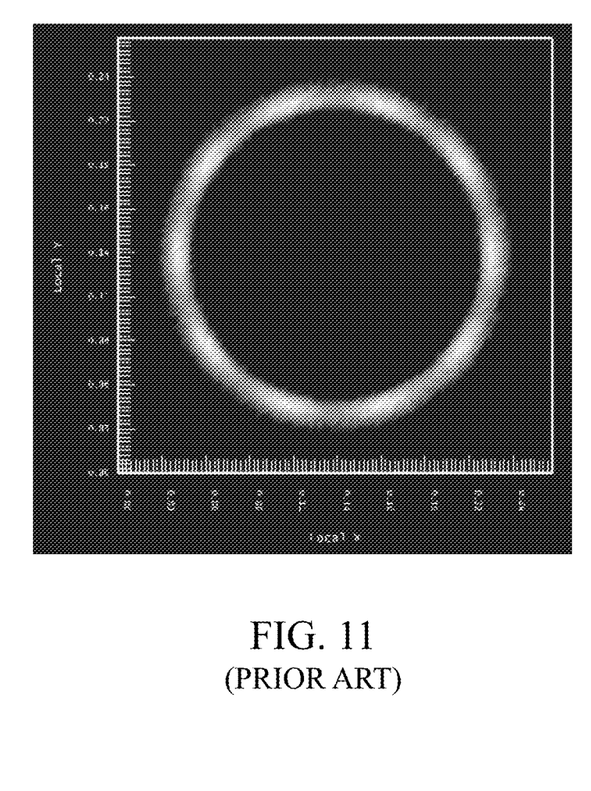
FIG. 11 illustrates a visual performance rendering of a prior art indicator light assembly when all the LEDs are lit, in accordance with an embodiment of the prior art indicator light assembly.

One such indicator light assembly used in said existing smart devices may include a plurality of light sources, such as light emitting diodes (LEDs) that are disposed in an optical cavity that is covered by a lens. However, light generated by said indicator light assembly where the LEDs are disposed in an optical cavity may be dim and non-uniform (e.g., multiple individual points of light or bright spots are readily discernible by the viewer) as illustrated in FIGS. 9 and 11. So, said indicator light assembly used in existing smart devices (e.g., where the LEDs are disposed in an optical cavity) may be unsuitable for use in smart light fixtures because the light generated by said indicator light assembly may be washed out or masked by the light generated by the smart light fixture to illuminate an area of interest.

Another indicator light assembly used in existing smart devices may include an arrangement of one or more LEDs and a reflector that are configured to generate indirect light. In said indicator light assembly, the light from the LEDs may be reflected by the reflector onto an exit surface, and the reflected light is used as the indicator light. However, like the indicator light assembly where the LEDs are disposed in an optical cavity, the indicator light that is generated by the indicator light assembly with the reflector and LED arrangement may be dim. That is, said indicator light assembly with the reflector does not maximize the amount of light or flux from the LEDs that is incident on an exit surface and/or exiting from the exit surface. Further, said indicator light assembly with the reflector provides less or very little control of the indicator light, which in turn limits the ability to change a viewing angle, brightness, efficiency, etc.

This background information is provided to reveal information believed to be of possible relevance to the present disclosure. No admission is necessarily intended, nor should be construed, that any of the preceding information constitutes prior art against the present disclosure.

SUMMARY

In one aspect, the present disclosure is directed to an indicator light assembly. The indicator light assembly includes a plurality of light directing optical devices. Each light directing optical device of the plurality of light directing optical devices includes a light receiving end and a light emitting end. The plurality of light directing optical devices are arranged such that: (a) the light receiving ends of the plurality of light directing optical devices are separate and spaced apart from each other, and (b) the light emitting ends of the plurality light directing optical devices are coupled to each other to define a continuous light exit surface having a shape and such that the plurality of light directing optical devices form an integral unit.

In another aspect, the present disclosure is directed to a light fixture. The light fixture includes a housing. Further, the light fixture includes a light engine that is disposed in the housing and configured to generate a general lighting for illuminating an area in which the light fixture is disposed. Furthermore, the light fixture includes an indicator light assembly that is configured to generate an indicator light. The indicator light assembly includes a plurality of light directing optical devices comprising a first light directing optical device and a second light directing optical device. The first light directing optical device includes a first light receiving end and a first light emitting end and the second light directing optical device comprising a second light receiving end and a second light emitting end. The first light directing optical device and the second light directing optical device are arranged such that: (a) the first light receiving end of the first light directing optical device and the second light receiving end of the second light directing optical device are detached and spaced apart from each other, and (b) the first light emitting end of the first light directing optical device and the second light emitting end of the second light directing optical device are coupled to each other to define at least a portion of a light exit surface having a shape and such that the indicator light assembly forms an integral unit.

In yet another aspect, the present disclosure is directed to an indicator light assembly. The indicator light assembly includes a light directing optical device. The light directing optical device includes a plurality of light receiving ends that are detached and spaced apart from each other. Further, the light directing optical device includes a continuous light exit surface that is opposite to the plurality of light receiving ends. The light directing optical device is configured to direct light that enters each light receiving end of the plurality of light receiving ends to the continuous light exit surface to generate an indicator light.

These and other aspects, objects, features, and embodiments, will be apparent from the following description and the appended claims.

BRIEF DESCRIPTION OF THE FIGURES

The foregoing and other features and aspects of the present disclosure are best understood with reference to the following description of certain example embodiments, when read in conjunction with the accompanying drawings, wherein.

The drawings illustrate only example embodiments of the present disclosure and are therefore not to be considered limiting of its scope, as the present disclosure may admit to other equally effective embodiments. The elements and features shown in the drawings are not necessarily to scale, emphasis is instead placed upon clearly illustrating the principles of the example embodiments. Additionally, certain dimensions or positions may be exaggerated to help visually convey such principles.

DETAILED DESCRIPTION OF EXAMPLE EMBODIMENTS

The present disclosure describes an indicator light assembly in downlight fixtures. The indicator light assembly of the present disclosure may provide a more efficient method of propagating light to a desired exit surface to maximize the amount of light from light sources that is incident on said exit surface and thereby create a bright and more uniform visual indicator light.

In one example, the indicator light assembly of the present disclosure may be single integral unit that includes a series of light directing optical devices (e.g., light pipe structures or light directing features) that are arranged such that: (a) the light receiving ends of the light directing optical devices are separate and detached from each other, and (b) the light emitting ends of the light directing optical devices are coupled to each other to form a light exit surface having a desired shape. The light emitting end and the light receiving end of each light directing optical device are opposite to each other. Light sources may be positioned at the light receiving ends of the light directing optical devices such that light from the light sources enters the light directing optical devices through the light receiving ends of the respective light directing optical devices. The light directing optical devices have unique geometries that are configured to direct the light entering the light directing optical devices through the light receiving end to the light exit surface in a manner that increases the light incident on the light exit surface of the indicator light assembly. In other words, the light directing optical devices are configured to maximize the luminous flux that is incident upon the light exit surface, which in turn increases the amount of luminous flux that exits the light exit surface as an indicator light and enters an area (e.g., room) in which a light fixture (e.g., downlight fixture) with the indicator light assembly is mounted.

Even though the present disclosure describes that light sources may be positioned at or adjacent the light receiving ends of the light directing optical devices, in some example embodiments, light receiving devices such as photocells, light sensor, etc., may be positioned at the light receiving ends of the light directing optical devices instead of the light sources without departing from a broader scope of the present disclosure. In said example embodiments, the light exit surface of the indicator light assembly that is defined by the light emitting ends of the light directing optical devices may operate as a light receiving surface that receives light therethrough, and the light receiving ends of the light directing optical devices may operate as the light emitting ends that direct light that enters the light directing optical devices through the light exit surface towards the light receiving devices that are positioned at or adjacent the light receiving ends of the light directing optical devices.

Referring to FIGS. 1-7, an example indicator light assembly 100 of the present disclosure may include a plurality of light directing optical devices 102. Each light directing optical device 102 may include a light receiving end 104 and a light emitting end 106. The plurality of light directing optical devices 102 may be coupled to each other and arranged such that the light directing optical devices 102 are detached from each other at the light receiving ends 104 and are attached or coupled to each other at the light emitting ends 106. In particular, the light emitting ends 106 of the light directing optical devices 102 may be coupled to each other such that they define a light exit surface 108 that is continuous and through which an indicator light is emitted. In the example embodiment illustrated in FIGS. 1-7, the light directing optical devices 102 are arranged such that they define a substantially ring-shaped light exit surface 108. As such, in the example embodiment illustrated in FIGS. 1-7, the light directing optical devices 102 of the indicator light assembly 100 may be arranged in a ring shape such that they define an inner cavity 126. However, in other example embodiments, the light directing optical devices 102 may be coupled to each other in any other arrangement such that they define a light exit surface having any other appropriate shape without departing from a broader scope of the present disclosure. For example, the light directing optical devices 102 may be arranged such that they create a light exit surface that is shaped as an arrow (uni-directional or bi-directional), a rectangle, a triangle, etc.

In one example embodiment, the indicator light assembly 100 may be formed as a single integral unit (or single monolithic piece) where the light directing optical devices are integrally attached to each other, e.g., adjacent their light emitting ends as illustrated in FIGS. 1-7. Each light directing optical device 102 may be a component of the indicator light assembly 100. Further, the light directing optical devices 102 and/or the indicator light assembly 100 may be formed from a unitary piece of optical material. The optical material may include, but is not limited to, plastic, acrylic, polycarbonate, silicon, or any other appropriate material. In other words, the indicator light assembly 100 includes a single monolithic light directing optical device 195 that comprises multiple light receiving ends 104 projecting therefrom and a single continuous light exit surface 108. The light receiving ends 104 are detached and spaced apart from each other, and the light directing optical device 195 comprises a body 102 that extends from each light receiving end 104 towards the light exit surface 108.

In other example embodiments, the indicator light assembly 100 may be a multi-part unit where the light directing optical devices 102 may be removably coupled to each other without departing from a broader scope of the present disclosure. Further, in some example embodiments, the light directing optical devices 102 of the indicator light assembly 100 may be formed using a plurality of optical materials.

Each light directing optical device 102 may include a body 110 that is defined by a sidewall 112 that extends from the light receiving end 104 towards a portion of the light exit surface 108 that is defined by the light emitting end 106 of the light directing optical device 102. In the example embodiment illustrated in FIGS. 1-7, the body 110 of each light directing optical device 102 may be substantially parabolic in shape and the side wall 112 may taper as it progresses from the portion of the light exit surface 108 that is defined by the light emitting end 106 of the light directing optical device 102 towards the light receiving end 104 of the light directing optical device 102. That is, the light receiving end 104 of the light directing optical device 102 may be narrower than the light emitting end 106.

As illustrated in FIGS. 1-7, the light receiving end 104 may be substantially square shaped. Further, as illustrated in FIGS. 1-7, the sidewall 112 may include a first pair of sidewall segments 114 disposed opposite to each other and a second pair of sidewall segments 118. The first pair of sidewall segments 114 of a light directing optical device 102 may extend from a first pair of opposite ends 116 that define the light receiving end 104 towards the portion of the light exit surface 108 that is defined by the light emitting end 106 of the light directing optical device 102. Similarly, the second pair of sidewall segments 118 may extend from a second pair of opposite ends 120 that define the light receiving end 104 towards the portion of the light exit surface 108 that is defined by the light emitting end 106 of the light directing optical device 102. As illustrated in FIGS. 1-7, the first and second pair of sidewall segments (114, 118) may taper as they progress from the light exit surface 108 towards the light receiving end 104 of the light directing optical device 102. The tapered pair of sidewall segments (114, 118) may be flat in some example embodiments. However, in other example embodiments, the tapered pair of sidewall segments (114, 118) may be curved (e.g., concave or convex). The tapered pair of sidewall segments (114, 118) may be configured to direct light towards the light exit surface 108 with fewer ray reactions. Further, the tapered design of the sidewall 112 aids with the moldability of the indicator light assembly 100.

As illustrated in the example embodiment of FIGS. 1-7, the slope of the first pair of sidewall segments 114 may be less than the slope of the second pair of sidewall segments 118. However, in other example embodiments, the sidewalls may have substantially similar slope without departing from a broader scope of the present disclosure. Further, the sidewall 112 may be rotationally asymmetric about a central axis 122 of the light receiving end 104 (or the light directing optical device 102). That is, the second pair of sidewall segments 118 may be closer to a central axis 122 of the light receiving end 104 (or the light directing optical device 102) than the first pair of sidewall segments 114.

Even though the present disclosure describes a light directing optical device of a particular shape and size in association with FIGS. 1-7, in other example embodiments, the light receiving end 104 and the sidewall 112 of the light directing optical devices 102 may have any other appropriate shape that is configured to direct light that enters the light directing optical device 102 from the light receiving end 104 to the light exit surface 108 of the indicator light assembly to create the indicator light. For example, the light receiving end 104 may have a substantially circular shape and the sidewall 112 may be rotationally symmetric or asymmetric about a central axis of the light receiving end 104 (or the light directing optical device 102).

Further, the internal surface 124 of the sidewall 112 may be highly polished or reflective. The polished or reflective internal surface 124 of the sidewall 112 of each light directing optical device 102 may be configured to reflect and direct light entering the light receiving end 104 of the light directing optical device 102 to the light exit surface 108 of the indicator light assembly 100 via total internal reflection.

Figure 1:
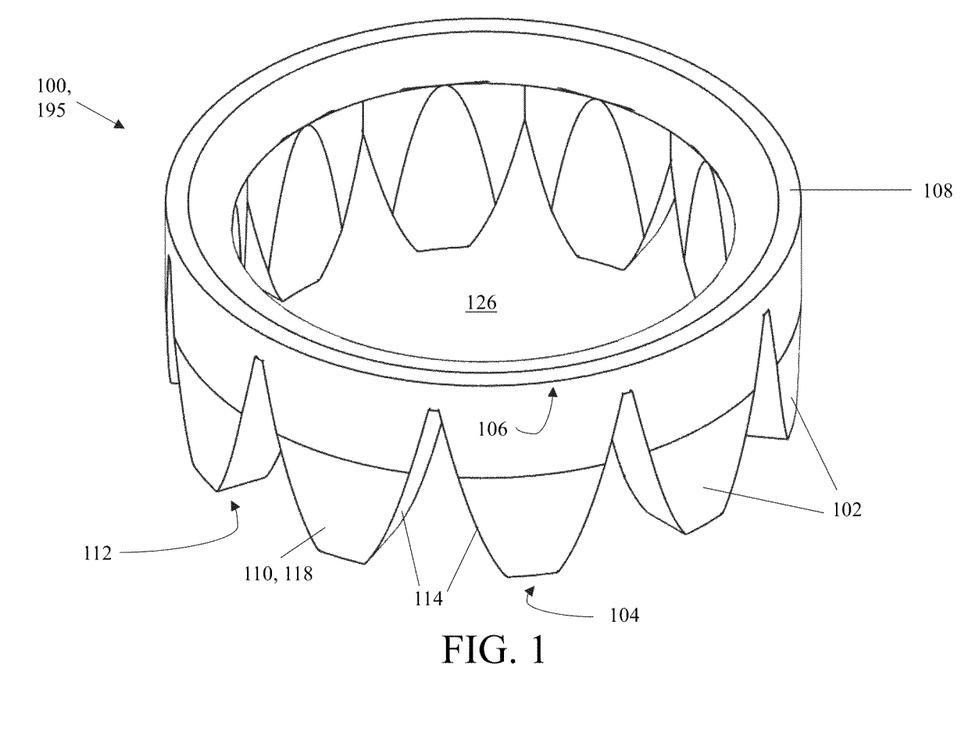
FIG. 1 illustrates a perspective view of an example indicator light assembly, in accordance with example embodiments of the present disclosure.
Figure 2:
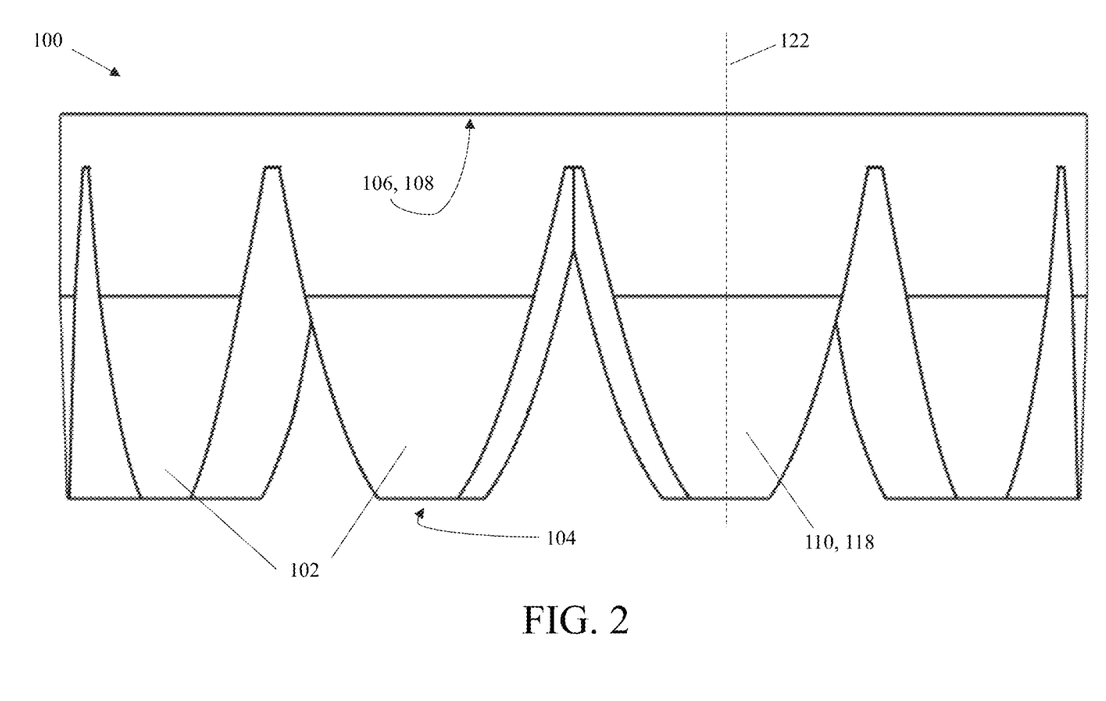
FIG. 2 illustrates a side view of the example indicator light assembly of FIG. 1, in accordance with example embodiments of the present disclosure.
Figure 3:
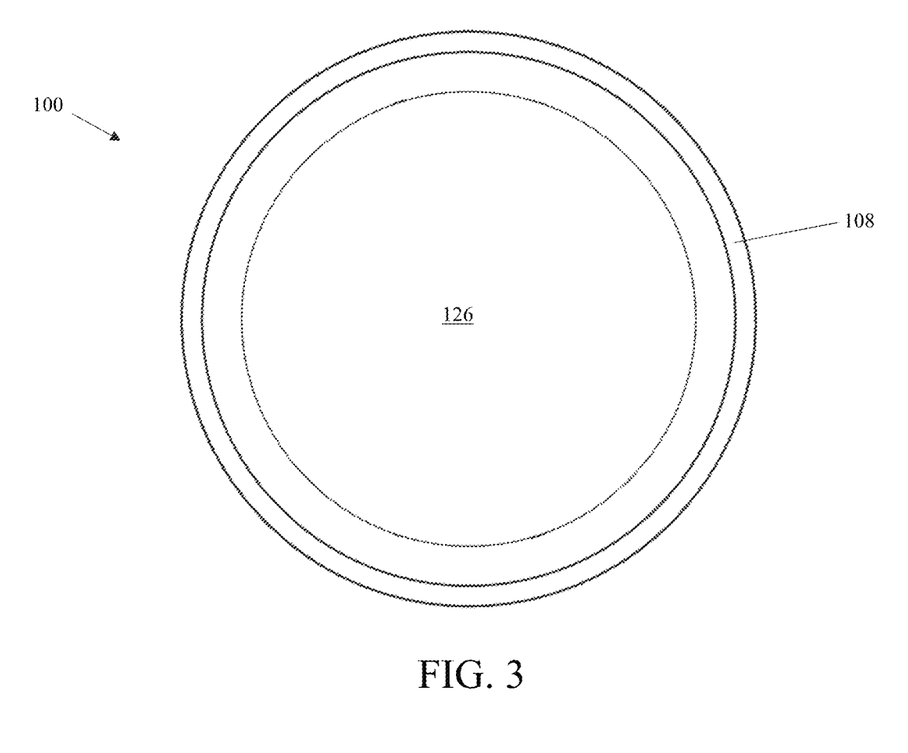
FIGS. 3 and 4 illustrate top and bottom views of the example indicator light assembly of FIG. 1, in accordance with example embodiments of the present disclosure.
Figure 4:
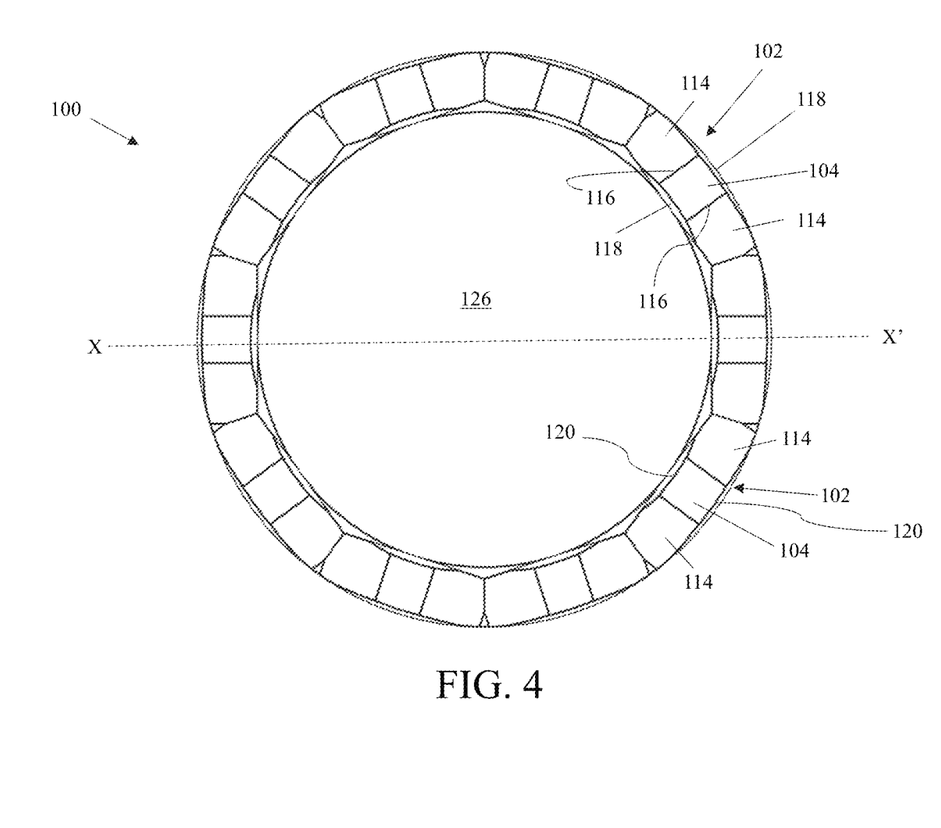
Figure 5:
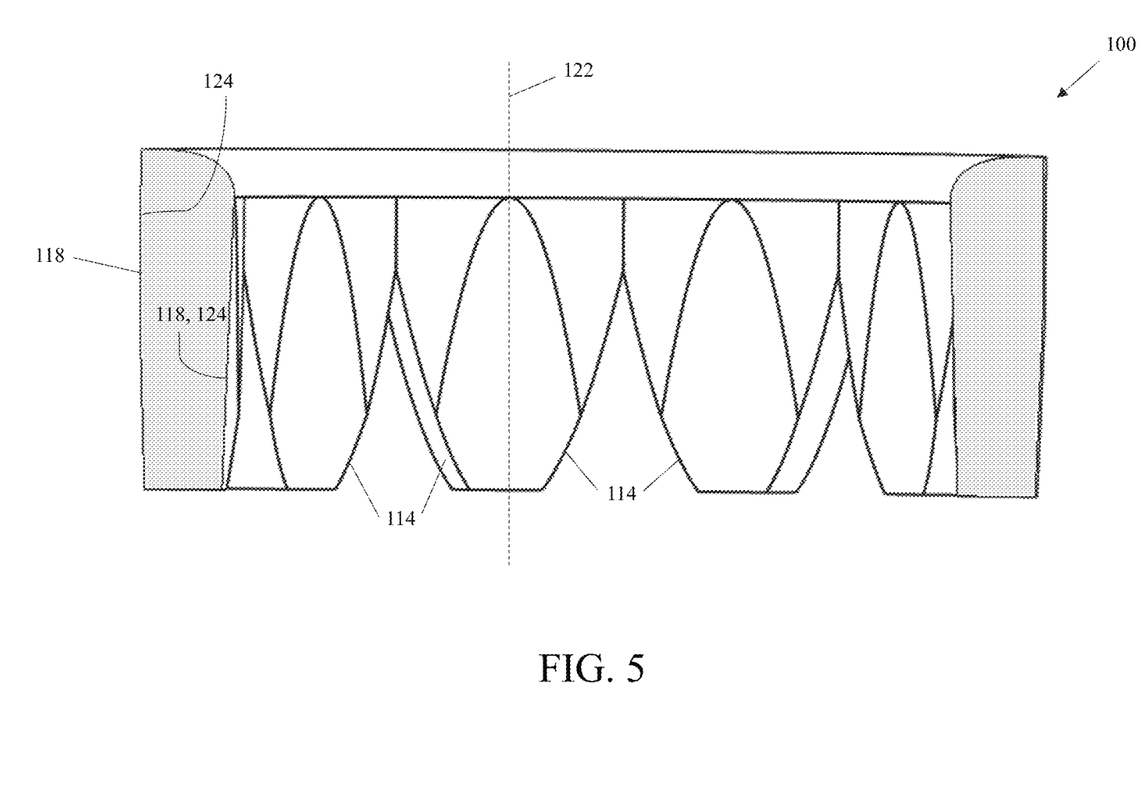
FIG. 5 illustrates a first cross-section view of the example indicator light assembly of FIG. 1 along an X-X' axis, in accordance with example embodiments of the present disclosure.

In some example embodiments, only a portion of the light emitting end 106 of each light directing optical device 102 may define the light exit surface 108. Accordingly, as illustrated in FIG. 5, a portion of the light emitting end 106 of the light directing optical device 102 may be flat (substantially perpendicular to the central axis 122) while a remainder of the light emitting end 106 may be curved down from the flat portion towards the sidewall 112. The curved portion may extend towards the inner cavity 126. In other example embodiments, the light emitting end 106 in its entirety may define the light exit surface 108, i.e., the flat and the curved surfaces.

Figure 6:
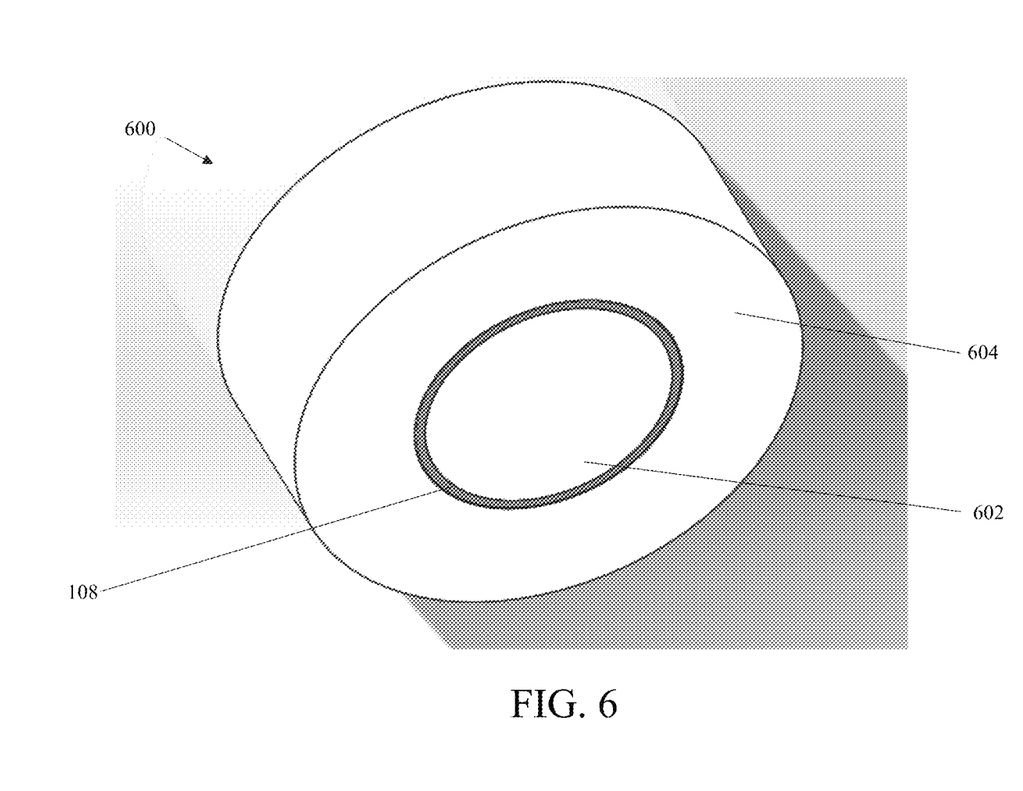
FIG. 6 illustrates an example downlight with the example indicator light assembly of FIG. 1 disposed therein, in accordance with example embodiments of the present disclosure.
Figure 7:
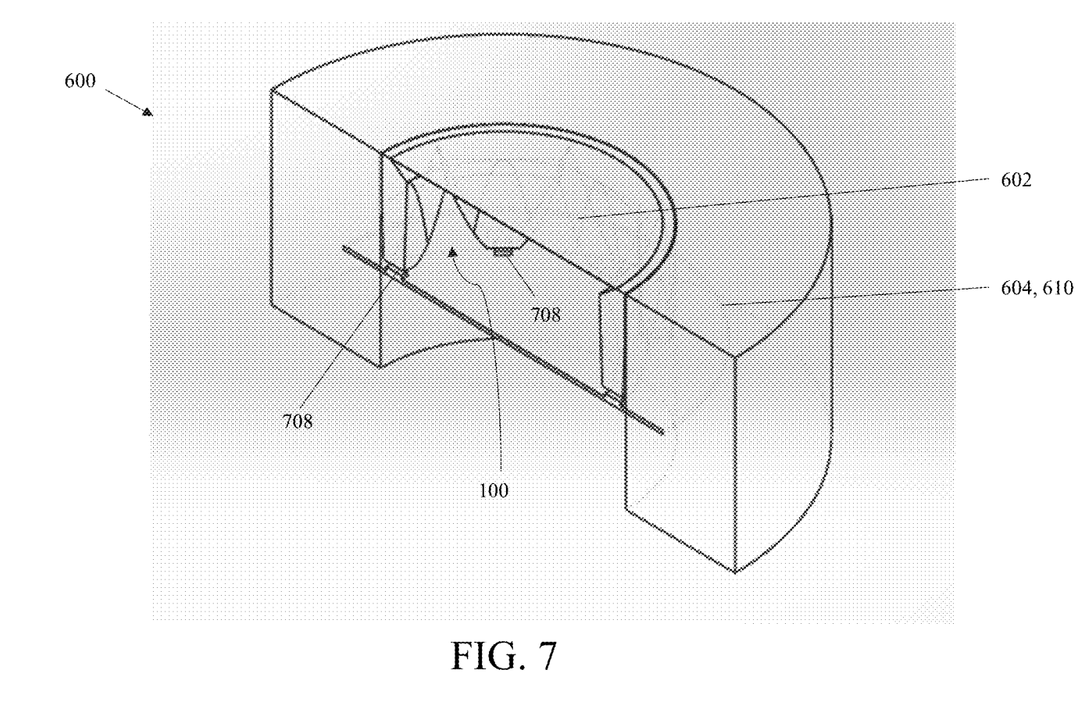
FIG. 7 illustrates a cross-section view of the example downlight of FIG. 7, in accordance with example embodiments of the present disclosure.

In some example embodiments, as illustrated in FIGS. 6-7, the curved surface may operate as a shoulder that is configured to support a lens 602 of a downlight fixture 600 in which the indicator light assembly 100 is disposed. A light from the downlight fixture 600 that is configured to illuminate an area (e.g., room) in which the downlight 600 is disposed may pass through the lens 602 of the downlight fixture 600. The light from the downlight fixture 600 that is configured to illuminate an area (e.g., room) in which the downlight 600 is disposed may be different from an indicator light that is emitted via the light exit surface 108 of the indicator light assembly 100 that is disposed in the downlight fixture 600. As illustrated in FIGS. 6-7, the indicator light assembly 100 may be disposed in a housing 604 of the downlight fixture 600 and the lens 602 of the downlight fixture 600 may be supported on the curved surface of the light emitting ends 106 of the light directing optical devices 102 of the indicator light assembly 100 such that: (a) the lens 602 covers the internal cavity 126 of the indicator light assembly 100, and (b) only the light exit surface 108 of the indicator light assembly 100 may be externally visible from the downlight 600 while the remainder of the indicator light assembly 100 may be concealed. In one example, a light source or a light engine of the downlight fixture 600 that is configured to generate light to illuminate an area in which the downlight fixture 600 is disposed may be placed in the internal cavity 126 of the indictor light assembly 100.

However, in other example embodiments, said light source of the downlight fixture 600 may be disposed in the housing 604 and in an area 610 that is outside or external to the indicator light assembly 100. In said other example embodiments, any other appropriate devices may be disposed in the internal cavity 126 of the indicator light assembly 100. For example, in said other example embodiments, an acoustic speaker and/or microphone may be disposed within the internal cavity 126 of the indicator light assembly 100. In said example embodiment where the acoustic speaker and/or microphone is disposed in the internal cavity 126 of the indicator light assembly 100, the downlight fixture 600 may not include the lens 602 that is configured to conceal the internal cavity 126.

Even though the present disclosure describes the indicator light assembly 100 as being disposed in a housing 604 of a downlight fixture 600 having a specific shape and size, one of skill in the art can understand and appreciate that in other example embodiments, the indicator light assembly 100 may be used with any other appropriate light fixture (e.g., recessed light fixture, surface mounted light fixture, wall wash light fixture, emergency exit light fixture, outdoor light fixture, etc.) without departing from a broader scope of the present disclosure. Further, even though the present disclosure describes the indicator light assembly as being used in a downlight fixture, one of skill in the art can understand and appreciate that in other example embodiments, the indicator light assembly 100 may be used in any other appropriate device without departing from a broader scope of the present disclosure. For example, the indicator light assembly 100 may be used with smart speakers, laptops, smartphones, wall switches, receptacles, sensors, receivers, transmitters, etc. In another example embodiment, the indicator light assembly 100 may be used as a stand-alone unit.

Figure 12:
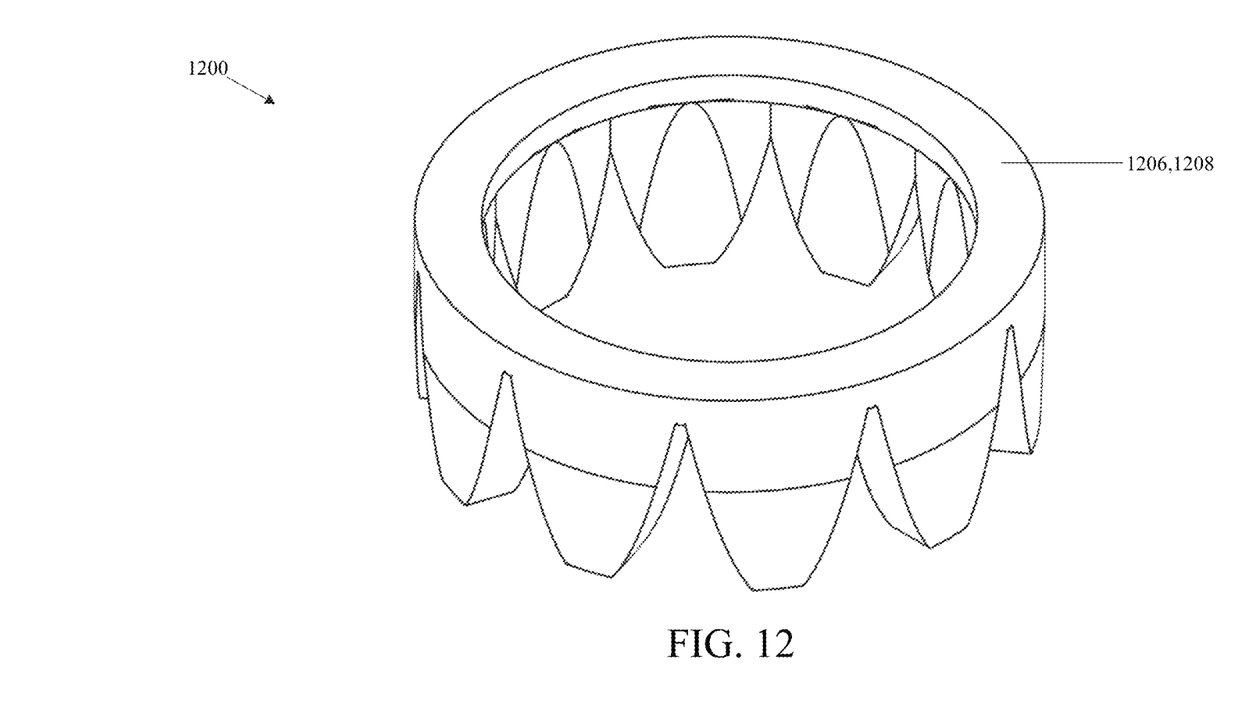
FIG. 12 illustrates a perspective view of another example indicator light assembly, in accordance with example embodiments of the present disclosure.
Figure 13:
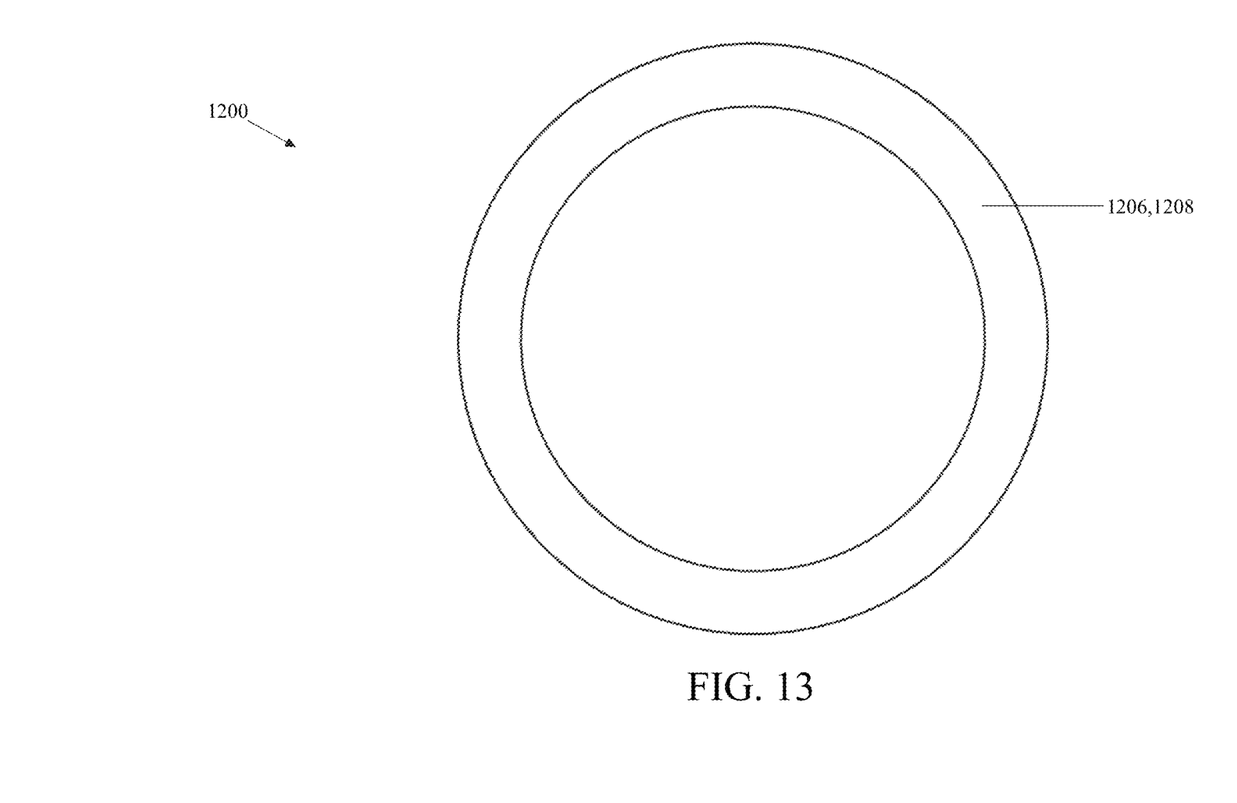
FIG. 13 illustrates a top view of the other example indicator light assembly of FIG. 12, in accordance with example embodiments of the present disclosure.
Figure 14:
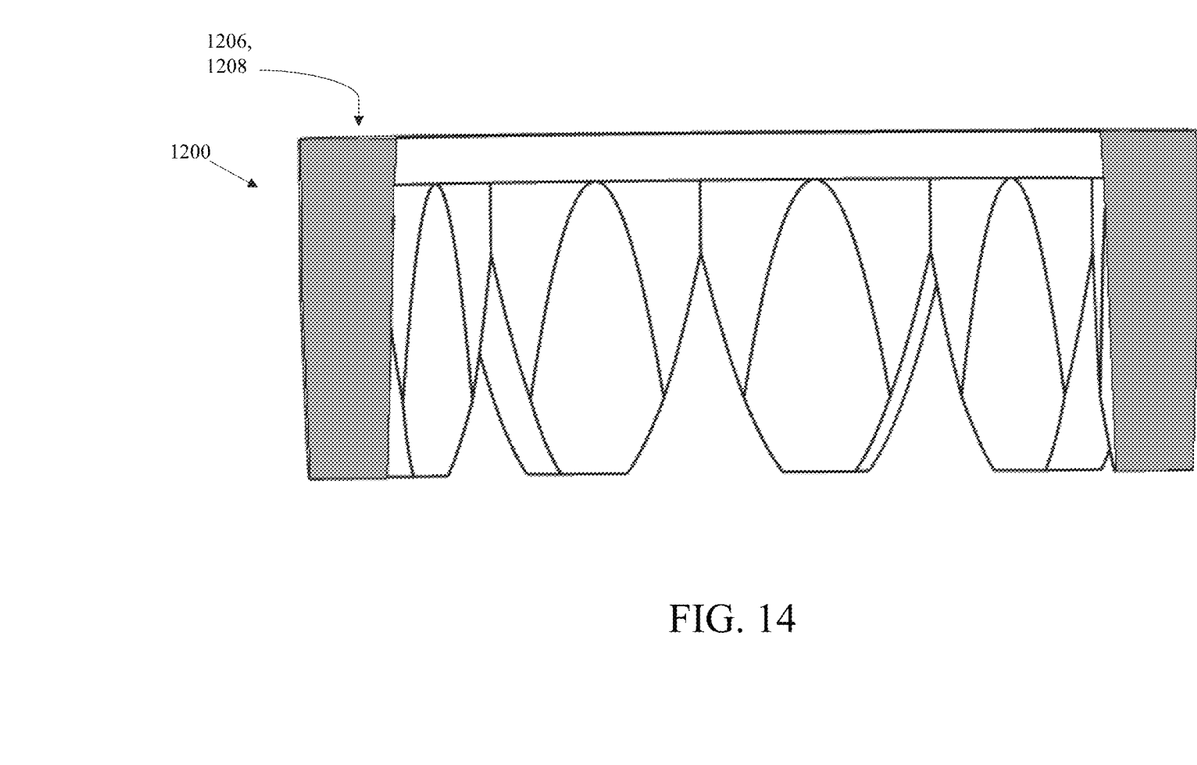
FIG. 14 illustrates a cross-section view of the other example indicator light assembly of FIG. 12, in accordance with example embodiments of the present disclosure.

Even though FIGS. 1-7 illustrate an indicator light assembly 100 where only a portion of the light emitting end 106 of each light directing optical device 102 defines the light exit surface 108, in other example embodiments, the light exit surface 108 may be defined by the light emitting end 106 in its entirety without departing from a broader scope of the present disclosure. For example, as illustrated in FIGS. 12-14, the light emitting end 1206 may be flat throughout and the light emitting end 1206 in its entirety may define the light exit surface 1208. As such, the light exit surface 1208 defined by the light emitting end 1206 (shown in FIGS. 12-13) may be wider than the light exit surface 108 defined by the light emitting end 106 (shown in FIGS. 1-7).

As illustrated in FIG. 7, a light source 708 may be disposed adjacent to and facing the light receiving end 104 of each light directing optical device 102 of the indicator light assembly 100. That is, if indicator light assembly 100 includes ten light directing optical devices 102, then, the indicator light assembly 100 may be provided with ten light sources, one for each light directing optical device 102. In some example embodiments, the light source 708 may be positioned below and spaced apart from the light receiving end 104 of the light directing optical device 102. However, in other example embodiments, the light source 708 may be in contact with the light receiving end 104 of the light directing optical device 102. In either case, light emitted by each light source 708 associated with the indicator light assembly 100 may enter a respective light directing optical device 102 of the indicator light assembly 100 via the light receiving end 104 of the respective light directing optical device 102. Light that enters each light directing optical device 102 via the light receiving end 104 may be directed to the light exit surface 108 of the indicator light assembly 100 by total internal reflection between the sidewall segments (114, 118) with minimal spillage to neighboring light directing optical devices 102. Then, the light exits the light exit surface 108 of the indicator light assembly 100 as indicator light.

In one example, the light source 708 may include light emitting diodes (LEDs) that are disposed on a substrate as illustrated in FIG. 7. However, in other examples, the light source 708 may include any other appropriate artificial light source, such as a halogen lamp.

In some example embodiments, a light receiving device such as a light sensor, a photocell, etc., may be disposed adjacent to and facing the light receiving end 104 of one or more light directing optical devices 102 instead of the light source. In said some example embodiments, the one or more light directing optical devices 102 of the indicator light assembly 100 that have light receiving devices disposed adjacent the light receiving ends 104 thereof may operate a light funnel that receives light through the light emitting ends 106 thereof and directs the received light towards the light receiving devices disposed adjacent the light receiving ends 104 thereof.

Figure 8:
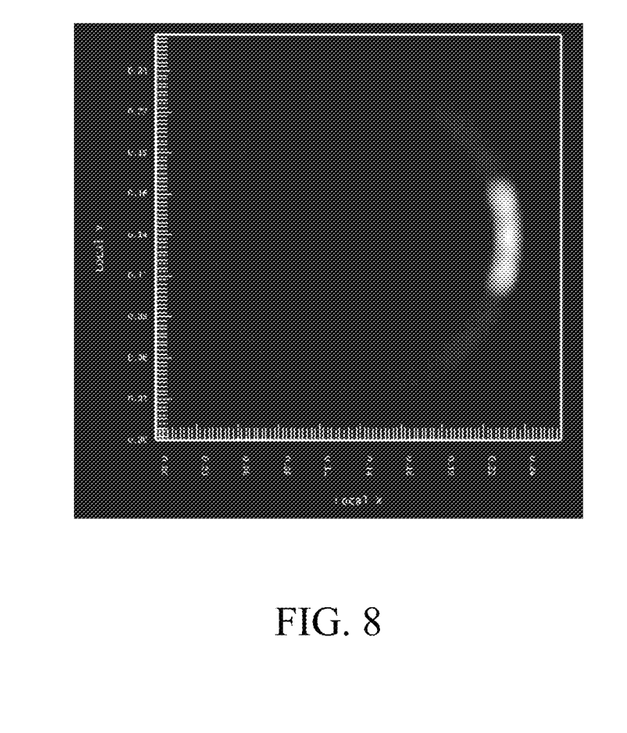
FIG. 8 illustrates a visual performance rendering of the example indicator light assembly of FIG. 1 when one of the LEDs is lit, in accordance with example embodiments of the present disclosure.
Figure 10:
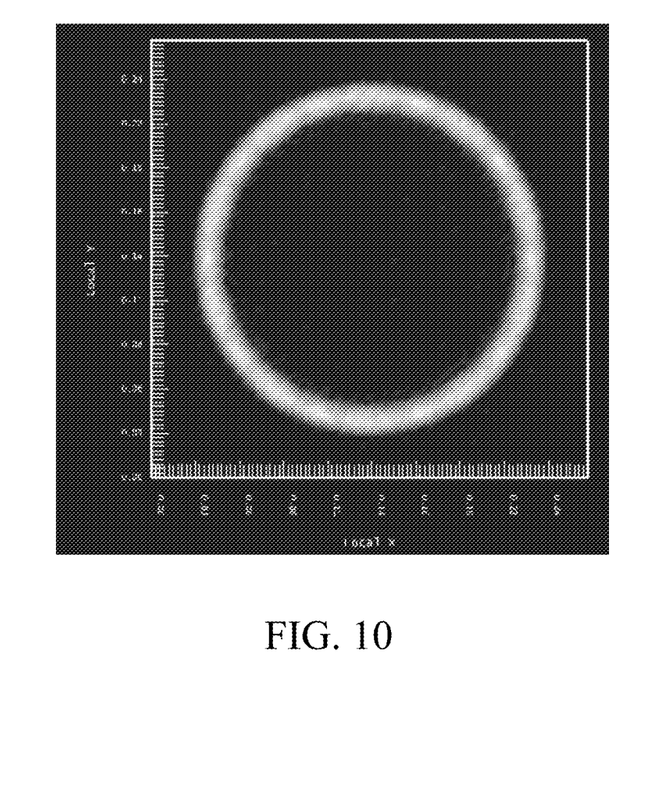
FIG. 10 illustrates a visual performance rendering of the example indicator light assembly of FIG. 1 when all the LEDs are lit, in accordance with example embodiments of the present disclosure.

The light directing optical devices 102 of the indicator light assembly maximize the amount of flux that is incident on and that exits the light exit surface 108 of the indicator light assembly 100, which in turn increases the uniformity, intensity, and brightness of the indicator light. For example, as illustrated in FIGS. 8 and 10, the indicator light generated by a single light directing optical device 102 and/or the indicator light assembly 100 of the present disclosure is brighter, more uniform, and more intense than the indicator light generated by existing/conventional indicator light assembly units in existing systems (shown in FIGS. 9 and 11). A dedicated light directing optical device 102 for each light source 708 minimizes the amount of light that spills towards neighboring light directing optical devices 102 and maximizes the amount of light directed to the light exit surface 108 of the indicator light assembly 100. The light exit surface 108 may also be referred to as indicator surface. Further, the dedicated light directing optical device 102 allows each light source of the indicator light assembly 100 to be independently controlled or each light directing optical device to be provided with a light source of different color. Further, the dedicated light directing optical devices 102 allows each segment of the light exit surface 108 to be independently controlled or lit as desired.

The ability to use light sources of different colors and the ability to independently control each light source associated with the indicator light assembly 100 allows different indicator light patterns to be created to represent different conditions (instructions, responses, statuses, commands, etc.). For example, in an example indicator light assembly 100 having ten light directing optical devices 102, light sources associated with the first, third, fifth, seventh, and ninth light directing optical devices may be sequentially lit to indicate a first information (e.g., move in a first direction—emergency exit direction); light sources associated with the first, third, fifth, seventh, and ninth light directing optical devices may be sequentially lit in the reverse order to indicate a second information (e.g., indicate increase in volume, etc.); light sources associated with the second, fourth, sixth, eighth, and tenth light directing optical devices may be sequentially lit to indicate a third information (e.g., indicate battery status, etc.), and so on. In another example, the light sources associated with the first, third, fifth, seventh, and ninth light directing optical devices may emit red light; while the light sources associated with the second, fourth, sixth, eighth, and tenth light directing optical devices may emit blue light.

Further, output characteristics of the indicator light (e.g., viewing angle, exit angle, etc.) may be controlled by changing the distance between the light source 708 and the light receiving ends 104 of each light directing optical device 102, by creating a cavity in the light directing optical device (e.g., extending from light receiving end 104 towards light emitting end 106), and/or by changing a shape of the light directing optical device 102 of the indicator light assembly 100. Furthermore, the light exit surface 108 of the indicator light assembly 100 may be textured to create diffusion glow.

Additionally, in one or more embodiments, the light exit surface 108 can have any appropriate profile and is not limited to the ones shown in FIGS. 1-14. For example, the light exit surface 108 may be curved or a combination of curved and flat, or the light exit surface 108 can include prismatic and/or patterned optical features as desired. That is, the light exit surface 108 and/or a portion of the light directing optical device 102 that is adjacent the light exit surface 108 can be configured using any appropriate optical feature (e.g., patterns, textures, light relief features, etches, prisms, micro-prisms, etc.,) and/or shaped in any appropriate manner to control any appropriate characteristic of the indicator light that is emitted therefrom and/or to achieve a desired form of indicator light.

Even though the present disclosure describes the light directing optical devices 102 to be formed using a single material, one of skill in the art can understand and appreciate that in other example embodiments, each light directing optical device 102 may be formed using different materials. That is, either different light directing optical devices 102 of an indicator light assembly 100 may be formed using different materials or different portions of each light directing optical device 102 may be formed using different materials. For example, a portion of the light directing optical device 102 from the light receiving end 104 to an intermediate section between the light receiving end 104 and the light emitting end 106 may be formed using a first material and a remaining portion from the intermediate section to the light emitting end 106 may be formed using a second material to achieve a specific output characteristics of the indicator light. Further, the light receiving end 104, light emitting end 106, and/or the sidewall 112 may be textured or patterned to obtain a desired characteristic of the indicator light. Furthermore, the sidewall 112 may include patterns, cuts, additional facets, etc., to obtain a desired characteristic of the indicator light.

Although example embodiments are described herein, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. A light fixture comprising:
a housing;
a light engine disposed in the housing and configured to illuminate an area; and
an indicator light assembly comprising:
a plurality of light sources,
a plurality of light directing optical devices, each light directing optical device having a light receiving end separate and spaced apart from the other light receiving ends, and a light emitting end coupled to the other light emitting ends to define a continuous light exit surface having a shape, such that the plurality of light directing optical devices form an integral unit, and wherein at least one of the plurality of light sources is disposed adjacent each of the light receiving ends of the plurality of light directing optical devices.

2. The light fixture of claim 1, wherein the shape is a ring-shape.

3. The light fixture of claim 1, wherein each light source is independently controllable to generate different light patterns by lighting at least a portion of the light exit surface.

4. The light fixture of claim 1,
wherein each light directing optical device further comprises a sidewall extending between the light receiving end and the light emitting end, defining a body configured to direct light entering each light emitting optical device through the light receiving end towards the light emitting end via total internal reflection.

5. The light fixture of claim 4, wherein the body is parabolic.

6. The light fixture of claim 4, wherein the sidewall tapers from the light emitting end to the light receiving end.

7. The light fixture of claim 4, wherein the sidewall is rotationally asymmetric about a central axis of the light directing optical device passing through the light emitting end and the light receiving end of the light directing optical device.

8. The light fixture of claim 4, wherein the sidewall is curved.

9. A light fixture comprising:
a housing;
a light engine disposed in the housing and configured to illuminate an area; and
an indicator light assembly comprising:
a plurality of light sources,
a light directing optical device that comprises:
a plurality of light receiving ends that are separate and spaced apart from each other; and
a continuous light exit surface that is opposite to the plurality of light receiving ends,
wherein at least one of the plurality of light sources is disposed adjacent each light receiving end of the plurality of light receiving ends, and is the light directing optical device is configured to direct light that enters each light receiving end of the plurality of light receiving ends to the continuous light exit surface to generate an indicator light.

10. The light fixture of claim 9, wherein the indicator light assembly comprises a sidewall that extends from each light receiving end of the plurality of light receiving ends to the continuous light exit surface.

11. The light fixture of claim 10, wherein the sidewall is curved.

12. A light fixture comprising:
a housing;
a light engine that is disposed in the housing and configured to generate a general lighting for illuminating an area in which the light fixture is disposed; and
an indicator light assembly that is configured to generate an indicator light, the indicator light assembly comprising:

a plurality of light directing optical devices comprising
a first light directing optical device and a second light directing optical device, the first light directing optical device comprising a first light receiving end and a first light emitting end and the second light directing optical device comprising a second light receiving end and a second light emitting end,
wherein the first light directing optical device and the second light directing optical device are arranged such that:
the first light receiving end of the first light directing optical device and the second light receiving end of the second light directing optical device are separate and spaced apart, and
the first light emitting end of the first light directing optical device and the second light emitting end of the second light directing optical device are coupled to define at least a portion of a light exit surface having a shape, such that the indicator light assembly forms an integral unit;
a first light source disposed adjacent the first light receiving end of the first light directing optical device such that light from the first light source enters the first light directing optical device through the first light receiving end; and
a second light source disposed adjacent the second light receiving end of the second light directing optical device such that light from the second light source enters the second light directing optical device through the second light receiving end.

13. The light fixture of claim 12, wherein the first light source and the second light source are individually controllable to generate different light patterns for the visual communication.

14. The light fixture of claim 12, wherein the first light source and the second light source are light emitting diodes (LEDs).

15. The light fixture of claim 12:
wherein the first light directing optical device comprises a first sidewall that extends from the first light receiving end to the first light emitting end;
wherein the first sidewall is configured to direct light from the first light source that enters the first light directing optical device through the first light receiving end towards the first light emitting end via total internal reflection.

16. The light fixture of claim 15, wherein each of the first light directing optical device and the second light directing optical device comprises a body that is parabolic.

17. The light fixture of claim 15, wherein the first sidewall tapers from the first light emitting end to the first light receiving end.

18. The light fixture of claim 15, wherein the first sidewall is rotationally asymmetric about a central axis of the first light directing optical device passing through the first light emitting end and the first light receiving end of the first light directing optical device.

* * * * *